United States Patent

Takashima et al.

[11] Patent Number: 5,821,613
[45] Date of Patent: Oct. 13, 1998

[54] SEMICONDUCTOR DEVICE IN WHICH SEMICONDUCTOR CHIP HAS BOTTOM SURFACE WITH REDUCED LEVEL OF ORGANIC COMPOUNDS RELATIVELY TO OTHER SUFACES THEREOF

[75] Inventors: Akira Takashima; Mitsutaka Sato, both of Kawasaki; Shinichirou Taniguchi, Kagoshima, all of Japan

[73] Assignees: Fujitsu Limited, Kawasaki; Kyushu Fujitsu Electronics Limited, Kagoshima, both of Japan

[21] Appl. No.: 919,170

[22] Filed: Aug. 28, 1997

Related U.S. Application Data

[63] Continuation of Ser. No. 605,834, Feb. 22, 1996, abandoned, which is a continuation of Ser. No. 257,036, Jun. 8, 1994, abandoned.

[30] Foreign Application Priority Data

Sep. 20, 1993 [JP] Japan ................................ 5-233878

[51] Int. Cl.$^6$ .................................................. H01L 23/495
[52] U.S. Cl. .......................... 257/676; 257/682; 257/784; 438/473
[58] Field of Search ..................................... 257/666, 676, 257/735, 784, 682; 438/473

[56] References Cited

U.S. PATENT DOCUMENTS

| 4,916,519 | 4/1990 | Ward ........................................ 257/784 |
| 5,233,220 | 8/1993 | Lamson et al. ........................... 257/784 |
| 5,233,222 | 8/1993 | Djennas et al. .......................... 257/676 |
| 5,264,730 | 11/1993 | Matsuzaki et al. ..................... 257/676 |
| 5,302,849 | 4/1994 | Cavasin ................................... 257/676 |
| 5,327,008 | 7/1994 | Djennas et al. .......................... 257/676 |
| 5,359,224 | 10/1994 | Heinen et al. .......................... 257/784 |
| 5,436,500 | 7/1995 | Park et al. ............................... 257/735 |
| 5,442,231 | 8/1995 | Miyamoto et al. ..................... 257/784 |

FOREIGN PATENT DOCUMENTS

| 2-290046 | 11/1990 | Japan . |
| 3-296249 | 1/1991 | Japan . |
| 4-206855 | 7/1992 | Japan . |

*Primary Examiner*—David Ostrowski
*Attorney, Agent, or Firm*—Staas & Halsey

[57] ABSTRACT

A method of manufacturing a semiconductor device which includes a semiconductor chip and a plastic package of a thermosetting polymer encapsulating the semiconductor chip through a molding process. The thermosetting polymer of the plastic package fully or partially covers a bottom surface of the semiconductor chip. An ultraviolet cleaning process is performed for cleaning the bottom surface of the semiconductor chip prior to the molding process.

14 Claims, 8 Drawing Sheets

FIG. I PRIOR ART
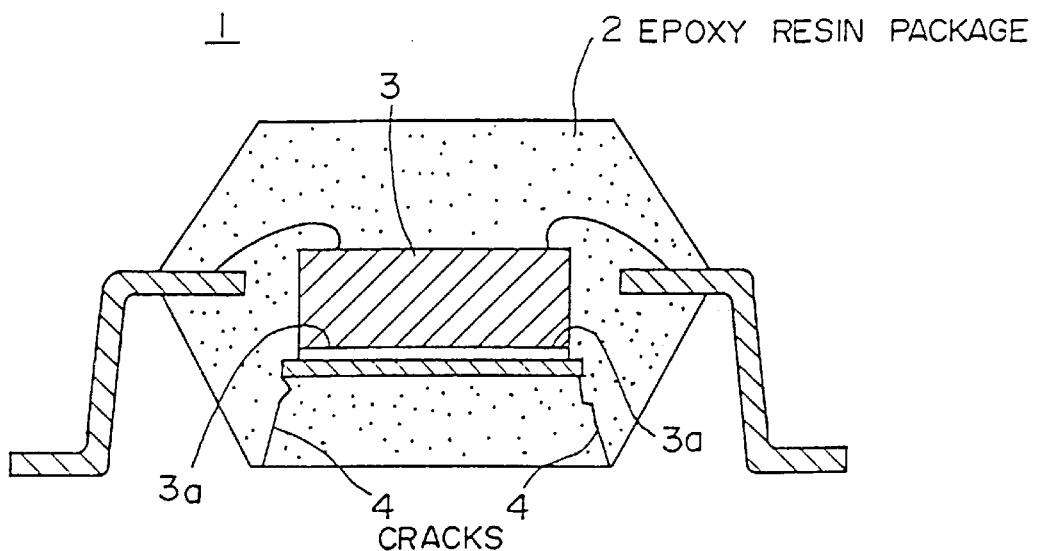
FIG. 2
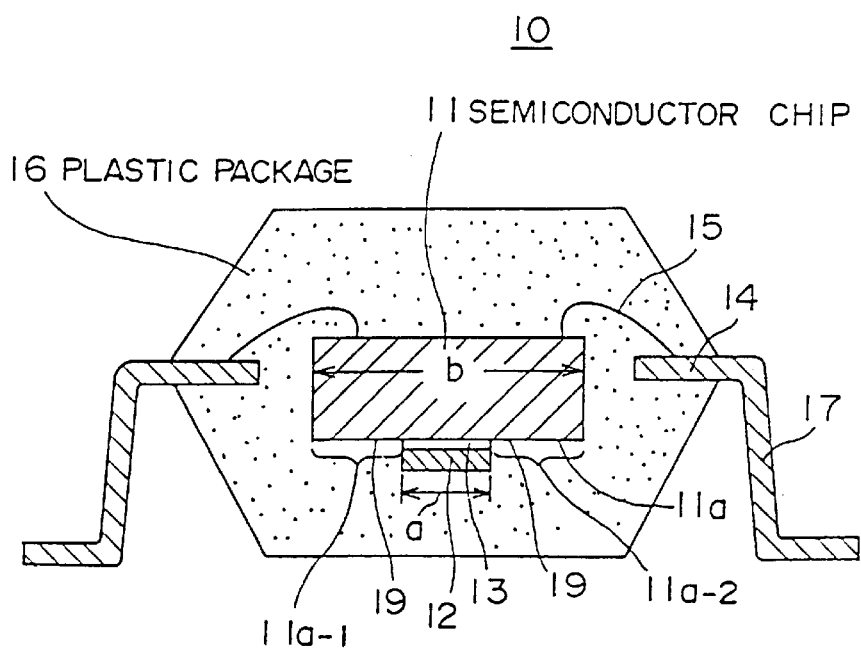

SEMICONDUCTOR DEVICE IN WHICH SEMICONDUCTOR CHIP HAS BOTTOM SURFACE WITH REDUCED LEVEL OF ORGANIC COMPOUNDS RELATIVELY TO OTHER SUFACES THEREOF

This application is a continuation of application Ser. No. 08/605,834, filed Feb. 22, 1996, which is a continuation of application Ser. No. 08/257,033, filed Jun. 8, 1994, both now abandoned.

BACKGROUND OF THE INVENTION (1) Field of the Invention

The present invention generally relates to a semiconductor device and, more particularly, to a semiconductor device in which a semiconductor chip is bonded to lead portions and encapsulated in plastic, the semiconductor chip having a bottom surface covered with the plastic, which plastic is likely to crack due to heat stresses.

(2) Description of the Prior Art

A semiconductor device in which a semiconductor chip is bonded to lead portions and enclosed in a plastic package is known. Before the plastic package is molded to enclose the semiconductor chip, the semiconductor chip is bonded onto a die pad, the semiconductor chip having a bottom surface covered with the die pad. When the semiconductor device of this type is bonded onto a printed circuit board, a portion of the plastic package on the bottom surface of the semiconductor chip is affected by heat. The portion of the plastic package on the bottom surface of the semiconductor chip is likely to crack due to heat stresses between the plastic package and corners of the die pad. To increase the reliability of the semiconductor device as a manufactured product, it is desirable that the plastic package does not crack if the heat stresses occur.

FIG. 1 shows a conventional semiconductor device in which a semiconductor chip is bonded to lead portions and enclosed in a plastic package. In FIG. 1, the semiconductor device 1 has an epoxy resin package 2 and a semiconductor chip 3 enclosed in the epoxy resin package 2. A certain filler is added to the epoxy resin package 2 so as to increase the strength of the epoxy resin package 2.

In the semiconductor device 1, a bottom surface 3a of the semiconductor chip 3 is covered with a die pad, and the die pad adheres to the epoxy resin package 2. However, the adhesion between the epoxy resin package 2 and the die pad is not sufficiently firm.

The semiconductor device 1 is subjected to heat when it is bonded onto a printed circuit board, and especially a bottom portion of the epoxy resin package 2, covering corners of the die pad, is influenced by heat stresses. Moisture in the epoxy resin package 2 vaporizes in the heat. Since the volume of the vapor in the epoxy resin package 2 is much greater when the semiconductor device is subjected to heat than before it is heated, heat stresses between the semiconductor chip 3 and the die pad and heat stresses between the epoxy resin package 2 and the die pad are produced. The epoxy resin package 2 and the die pad at the corners are likely to be separated from each other. Cracks 4 in the bottom portion of the epoxy resin package 2 may be produced due to the heat stresses. If the epoxy resin package 2 cracks, the entry of humid air through the cracks into the epoxy resin package 2 will make the reliability of the semiconductor device 1 low, and will make the life of the semiconductor device 1 shorter.

SUMMARY OF THE INVENTION

Accordingly, it is a general object of the present invention to provide an improved semiconductor device in which the above described problems are eliminated.

Another, more specific object of the present invention is to provide a semiconductor device in which a semiconductor chip is bonded to lead portions and enclosed in a plastic package, adhesion between the semiconductor chip and the plastic package after the plastic package is molded around the semiconductor chip being increased to a level sufficient for preventing a portion of the plastic package on a bottom of the semiconductor chip from cracking due to heat stresses.

The above mentioned objects of the present invention are achieved by a semiconductor device which includes a semiconductor chip and a plastic package for enclosing the semiconductor chip in a plastic material through a molding process, the plastic package fully or partially covering a bottom surface of the semiconductor chip with the plastic material, wherein an ultraviolet cleaning process is performed for cleaning the bottom surface of the semiconductor chip prior to the molding process.

According to the present invention, it is possible to increase adhesion between the semiconductor chip and the plastic package after the molding process is performed, thereby preventing the plastic package from cracking due to heat stresses. The reliability of the semiconductor device thus manufactured can be increased, and the life of the semiconductor device can be made longer.

BRIEF DESCRIPTION OF THE DRAWINGS

The above and other objects, features and advantages of the present invention will be more apparent from the following detailed description when read in conjunction with the accompanying drawings in which:

FIG. 1 is a vertical cross-sectional view showing a conventional semiconductor device;

FIG. 2 is a vertical cross-sectional view showing a semiconductor device in a first embodiment of the present invention;

DESCRIPTION OF THE PREFERRED EMBODIMENTS

A description will now be given, with reference to FIGS. 2 through 6, of a first embodiment of a semiconductor device according to the present invention.

Figure 3:
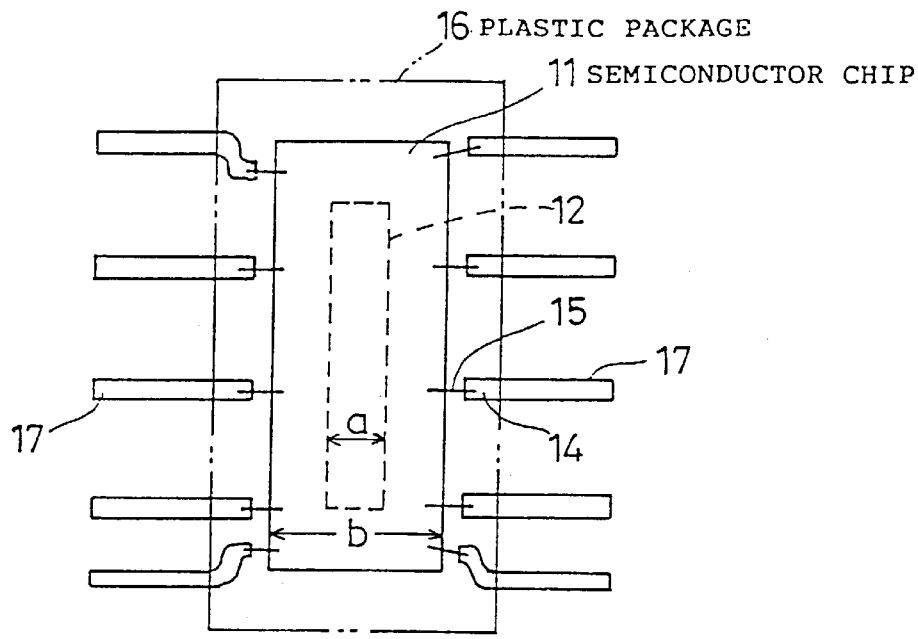
FIG. 3 is a plan view showing a semiconductor chip of the semiconductor device in FIG. 2 wherein a plastic package is omitted.
Figure 4:
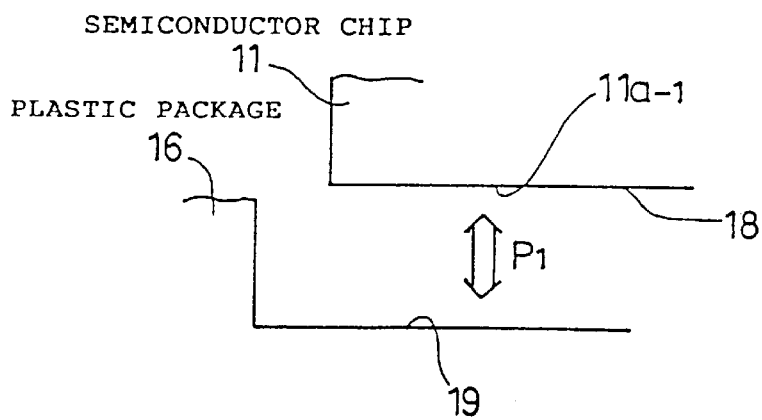
FIG. 4 is a diagram for explaining a molding step in which the semiconductor chip is enclosed in the plastic package in FIG. 2.

FIG. 2 shows a semiconductor device of the first embodiment. FIG. 3 shows a semiconductor chip of the semiconductor device in FIG. 2 wherein a plastic package is omitted. As shown in FIGS. 2 and 3, the semiconductor device 10 generally has a semiconductor chip 11, a stage 12, a set of inner lead portions 14, a set of wires 15, a lead 17, and a plastic package 16.

The chip 11 is primarily made of silicon. A silver paste layer 13 is formed on the top of the stage 12, and the semiconductor chip 11 is fixed to the stage 12 with the silver paste through a chip bonding process. The width of the stage 12, indicated by the arrow "a" in FIG. 3, is smaller than the width of the semiconductor chip 11, indicated by the arrow "b" in FIG. 3. The peripheral portions of the semiconductor chip 11 extend outwardly from the periphery of the stage 12.

An integrated circuit on the semiconductor chip 11 is connected to the inner lead portions 14 via the wires 15. The plastic package 16 is primarily made of a thermosetting polymer such as epoxy resin. The chip 11, the stage 12, the wires 15, and the inner lead portions 14 are enclosed in the plastic package 16. The lead 17 outwardly projects from the periphery of the plastic package 16.

The bottom peripheral portions 11a-1 11a-2 of the bottom surface 11a of the semiconductor chip 11 directly come into contact with the thermosetting polymer of the plastic package 16, as indicated in FIG. 2. The bottom peripheral portions 11a-1, 11a-2 are subjected to radiation of ultraviolet rays, of wavelengths 2537 Å and 1849 Å for a given time period, during an ultraviolet cleaning process. Undesired organic compounds, which may be sticking to the semiconductor chip since the wafer process, are removed from the semiconductor chip 11 after the ultraviolet cleaning process is performed.

In the ultraviolet cleaning process described above, the radiation of the 1849 Å ultraviolet rays accelerates decomposition of oxygen gas ($O_2$) in the air to radical oxygen ions ($O^+$), and produces ozone ($O_3$) in high energy state. At the same time as mentioned above, the radiation of the 2537 Å ultraviolet rays accelerates decomposition of organic compounds into radical carbon ions ($C^+$) and radical hydrogen ions ($H^+$) by cutting C—H bonds. The radical carbon ions ($C^+$) and the ozone ($O_3$) react together to produce carbon dioxide gas ($CO_2$). The radical hydrogen ions ($H^+$) and the ozone ($O_3$) react together to produce water ($H_2O$). The carbon dioxide gas and the water can easily be removed. Accordingly, the undesired organic compound can be removed from the semiconductor chip 11 after the ultraviolet cleaning process described above is performed.

As described above, the bottom peripheral portions 11a-1, 11a-2 of the semiconductor chip 11 are modified by the ultraviolet cleaning process so as to create a clean and hydrophilic surface 18. Thus, the surface 19 of the plastic package 16 firmly adheres to the bottom peripheral portions 11a-1, 11a-2 of the semiconductor chip 11. The resultant adhesion (P1) between the semiconductor chip 11 and the plastic package 16, at the bottom peripheral portions 11a-1, 11a-2 after the ultraviolet cleaning process is performed, is stronger than the adhesion between the semiconductor chip and the plastic package when no ultraviolet cleaning is performed.

Therefore, the semiconductor device 10 has the semiconductor chip 11 with an increased adhesion to the plastic package 16 at the bottom peripheral portions 11a-1, 11a-2 because of the ultraviolet cleaning process described above.

The semiconductor device 10 in the first embodiment has the following advantages. The semiconductor device 10 is subjected to heat when it is mounted on a printed circuit board, and especially the bottom portion of the plastic package 16 is influenced by the heat stress. The plastic package surface and the chip surface are likely to be separated from each other due to the heat stress at this time. As the adhesion between the semiconductor chip 11 and the plastic package 16 at the portions 11a-1, 11a-2 is increased remarkably, when compared with that of a conventional semiconductor device, the separation of the plastic package surface and the chip surface, as described above, can be prevented.

Accordingly, in the semiconductor device of the first embodiment, the adhesion between the semiconductor chip and the plastic package after the molding process is performed can be remarkably increased, thereby preventing the plastic package from cracking due to the heat stresses.

The humidity resistance of the semiconductor device 10 according to the present invention is higher than that of the conventional device, and the life of the semiconductor device is longer than that of the conventional device. The reliability of the semiconductor devices thus manufactured is increased.

Figure 5:
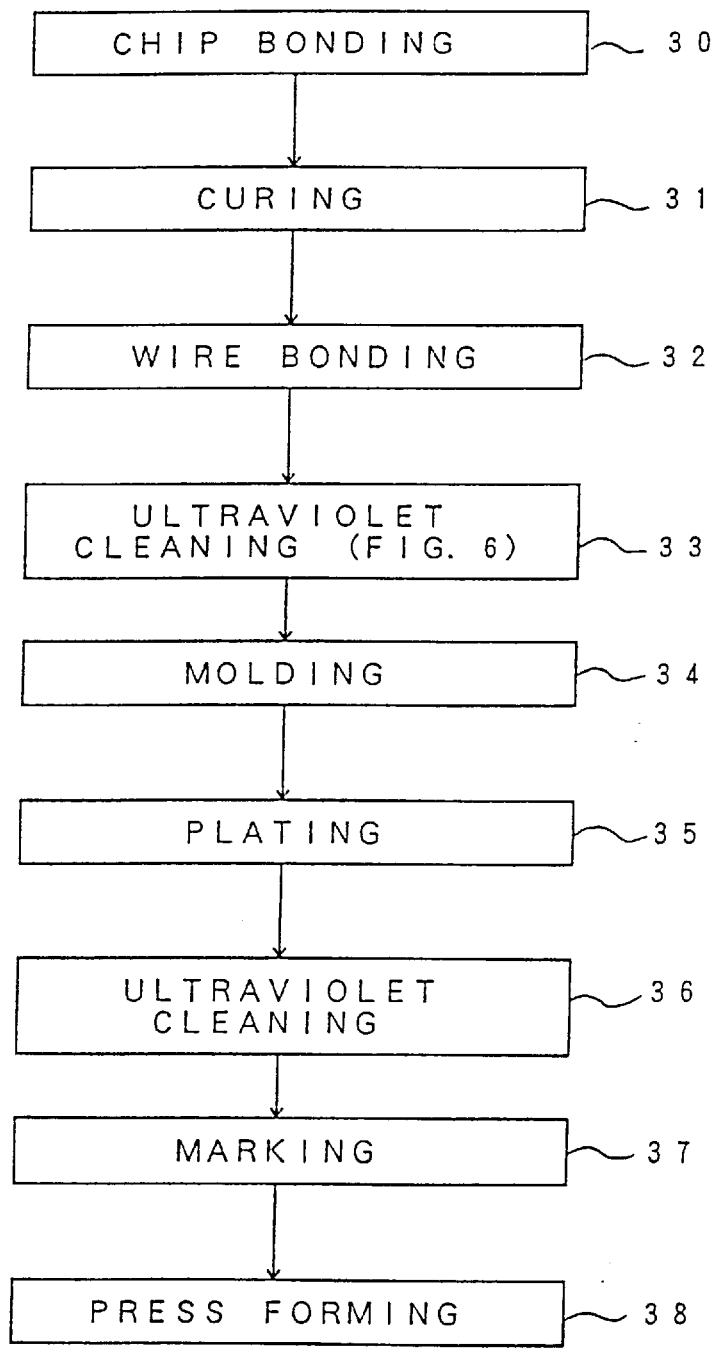
FIG. 5 is a flow diagram for explaining a sequence of manufacturing steps for manufacturing the semiconductor device in the first embodiment.
Figure 6:
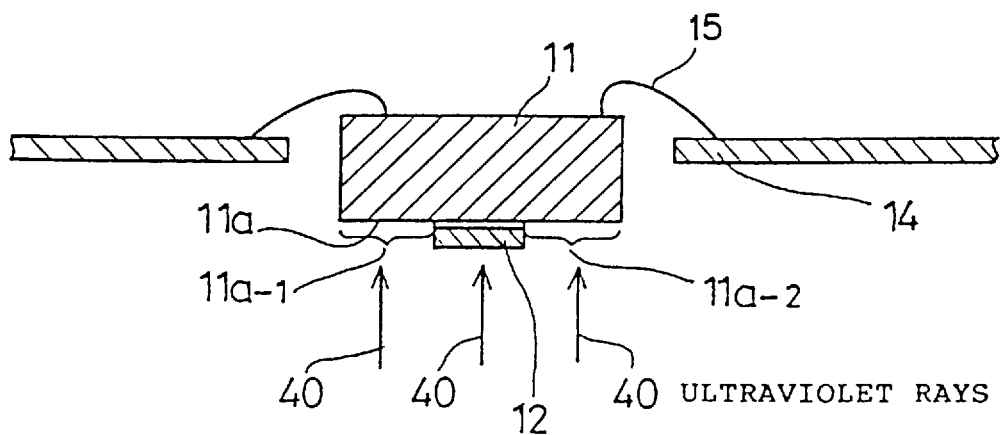
FIG. 6 is a diagram for explaining an ultraviolet cleaning step of the manufacturing steps in FIG. 5.

Next, a description will be given of a sequence of manufacturing steps for manufacturing the semiconductor device 10. FIG. 5 shows the sequence of the manufacturing steps. FIG. 6 shows an ultraviolet cleaning step of the manufacturing steps in FIG. 5.

Step 30 in the manufacturing steps in FIG. 5 is a chip bonding process wherein the semiconductor chip 11 is mounted on the stage 12 and the semiconductor chip is bonded to the stage 12 using the silver paste.

Step 31 is a curing process wherein the semiconductor chip 11, bonded to the stage 12, is heated to 150° C. for about 60 minutes, so as to cure the silver paste between the semiconductor chip 11 and the stage 12.

Step 32 is a wire bonding process wherein the wires 15 are bonded to the semiconductor chip 11, so as to connect the integrated circuit on the semiconductor chip 11 to the inner lead portions 14 via the corresponding wires 15.

Step 33 is the ultraviolet cleaning process described above. FIG. 6 shows the manner in which the ultraviolet cleaning step of the manufacturing steps in FIG. 5 is performed. As shown in FIG. 6, at the ultraviolet cleaning step 33, the ultraviolet rays 40 having the wavelengths 1849 Å and 2537 Å are radiated, for a given time period, to the bottom surface of the semiconductor chip 11 which surface is disposed on and thus partially covered with the stage 12. Only a portion of the bottom surface of the semiconductor chip 11, covered with the stage 12, is not subjected to the radiation of the ultraviolet rays.

After the ultraviolet cleaning step 33 is performed, the remaining organic compounds are removed from the semiconductor chip 11, and the bottom peripheral portions 11a-1, 11a-2 of the semiconductor chip 11 are modified to be clean and hydrophilic.

Step 34 is a molding process wherein the plastic package 16 is molded, using epoxy resin through a transfer molding procedure, so that the semiconductor chip 11 is enclosed in the plastic package 16.

Step 35 is a plating process wherein the lead 17, outwardly extending from the plastic package 16, is plated with metal.

Step 36 is an ultraviolet cleaning process wherein the ultraviolet rays, having the wavelengths 1849 Å and 2537 Å, are radiated to a marking surface of the plastic package 16 for a given time period. This process is similar to the above-described ultraviolet cleaning process at step 33. After the ultraviolet cleaning process at step 36 is performed, remaining organic compounds are removed from the marking surface of the plastic package 16, and the marking surface is modified to be clean.

Step 37 is a marking process wherein the plastic package 16 is marked with ink by using a stamper, so that a model number of the semiconductor device or the like is indicated on the marking surface of the plastic package 16. As the marking surface of the plastic package 16 is modified to be clean at step 36, a clear marking can be provided.

Step 38 is a press forming process wherein the lead 17 is bent by using progressive dies.

Accordingly, the semiconductor device 10 in FIG. 2 is produced after the manufacturing steps are performed as described above.

Next, a description will be given of a second embodiment of the semiconductor device according to the present invention.

Figure 7:
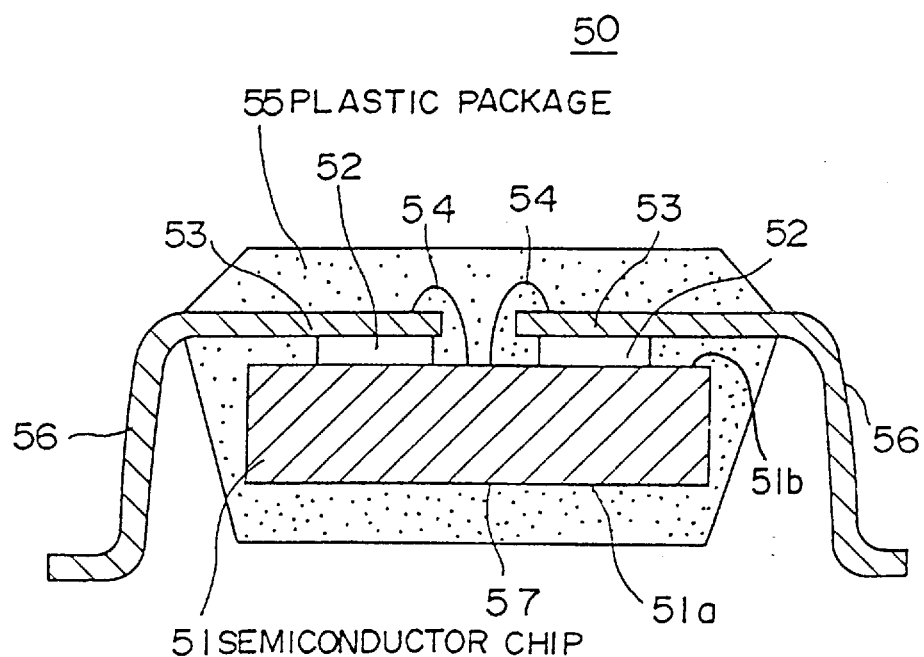
FIG. 7 is a sectional view showing a semiconductor device in a second embodiment of the present invention.
Figure 8:
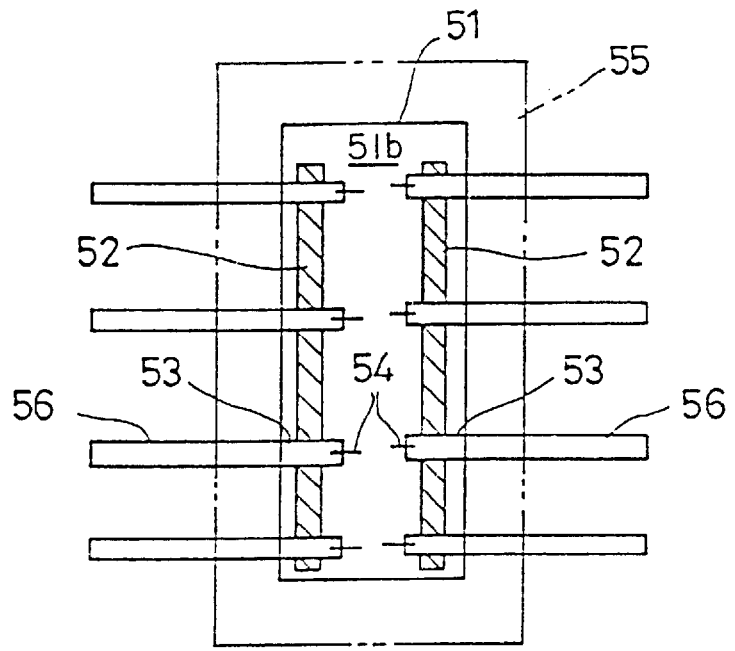
FIG. 8 is a plan view showing a semiconductor chip of the semiconductor device in FIG. 7 wherein a plastic package is omitted.

FIG. 7 shows a semiconductor device 50 of the second embodiment. The semiconductor device 50 has a lead-on-chip (LOC) structure wherein the lead is mounted on the semiconductor chip. FIG. 8 shows a semiconductor chip of the semiconductor device in FIG. 7 wherein a plastic package is omitted.

As shown in FIGS. 7 and 8, the semiconductor device 50 comprises a semiconductor chip 51, adhesive tapes 52, a set of inner lead portions 53, a set of wires 54, a lead 56, and a plastic package 55. As the semiconductor device 50 has a LOC structure with no stage, the semiconductor chip 51 has a bottom surface 51a, the entire area of which directly comes in contact with the plastic package 55.

The chip 51 is primarily made of silicon. The adhesive tapes 52 are attached to the top surface 51b of the semiconductor chip 51, and the inner lead portions 53 are fixed to the semiconductor chip 51 with the adhesive tapes 52.

The inner lead portions 53 are connected to a pad on the top surface of the semiconductor chip 51 via the wires 54. The plastic package 55 is primarily made of a thermosetting polymer such as epoxy resin. The chip 51, the adhesive tapes 52, the inner lead portions 53, and the wires 54 are enclosed in the plastic package 55. The leads 56 outwardly project from the periphery of the plastic package 55.

In the semiconductor device 50 described above, the bottom surface 51a of the semiconductor chip 51 is subjected to the radiation of the ultraviolet rays of the wavelengths 2537 Å and 1849 Å for a given time period in an ultraviolet cleaning process prior to a package molding process. Undesired organic compounds, which may stick to the semiconductor chip 51 in the course of the wafer process, are removed from the semiconductor chip 51 by performing the ultraviolet cleaning process prior to the package molding process.

As described above, the bottom surface 51a of the semiconductor chip 51 is modified to create a clean and hydrophilic surface 57, by performing the ultraviolet cleaning process prior to the package molding process.

Figure 9:
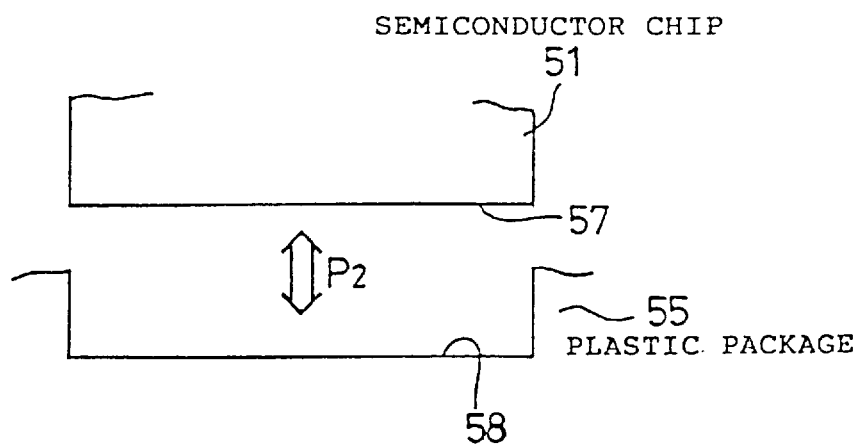
FIG. 9 is a diagram for explaining a molding step in which the semiconductor chip is enclosed in the plastic package of the semiconductor device in FIG. 7.

The chip 51 with the clean, hydrophilic bottom surface is enclosed in the plastic package 55 by performing the package molding process, as shown in FIG. 9. The resulting adhesion (P2) between the semiconductor chip 51 and the plastic package 55 on the bottom surface 51a, after the package molding process is performed following the ultraviolet cleaning process, is tougher than the adhesion between the semiconductor chip and the plastic package when no ultraviolet cleaning process is performed.

Therefore, the semiconductor device 50 after the package molding process has the semiconductor chip 51 with an increased adhesion to the plastic package 55. The entire bottom surface 51a of the semiconductor chip 51 firmly adheres to the plastic package 55 because of the ultraviolet cleaning process.

The semiconductor device 50 in the second embodiment has the following advantages. The semiconductor device 50 is subjected to heat when it is mounted on a printed circuit board, and especially a bottom portion of the plastic package 55 is influenced by a heat stress. The package surface and the chip surface are likely to be separated from each other due to the heat stress. However, the adhesion between the semiconductor chip 51 and the plastic package 55 at the bottom surface 51a is remarkably increased in comparison with that of the conventional device. As the adhesion mentioned above is firm enough to resist against the heat stress, the separation of the package surface and the chip surface is prevented. Thus, in the semiconductor device 50 according to the present invention, it is possible to prevent the plastic package 55 from cracking due to the heat stress.

The humidity resistance of the semiconductor device 50 in the second embodiment is increased from that of the conventional device, and the life of the semiconductor device can be made longer than that of the conventional device. The reliability of the semiconductor devices manufactured is thus increased.

Figure 10:
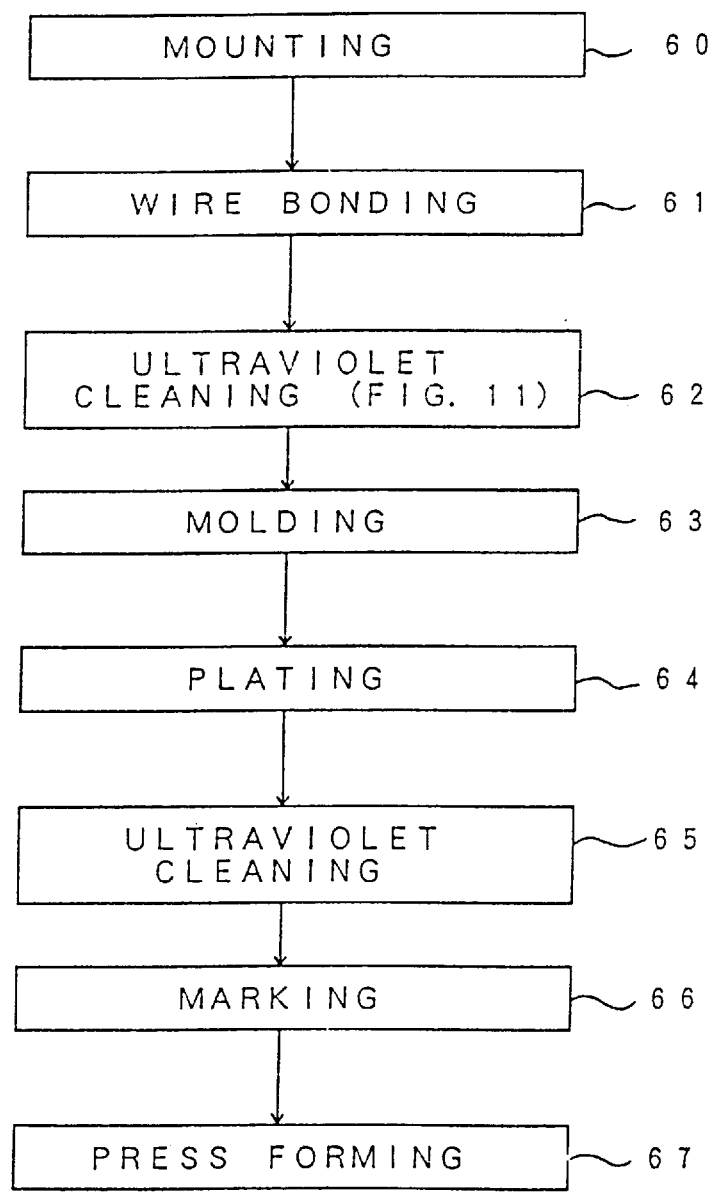
FIG. 10 is a flow diagram for explaining a sequence of manufacturing steps for manufacturing the semiconductor device in FIG. 7.
Figure 11:
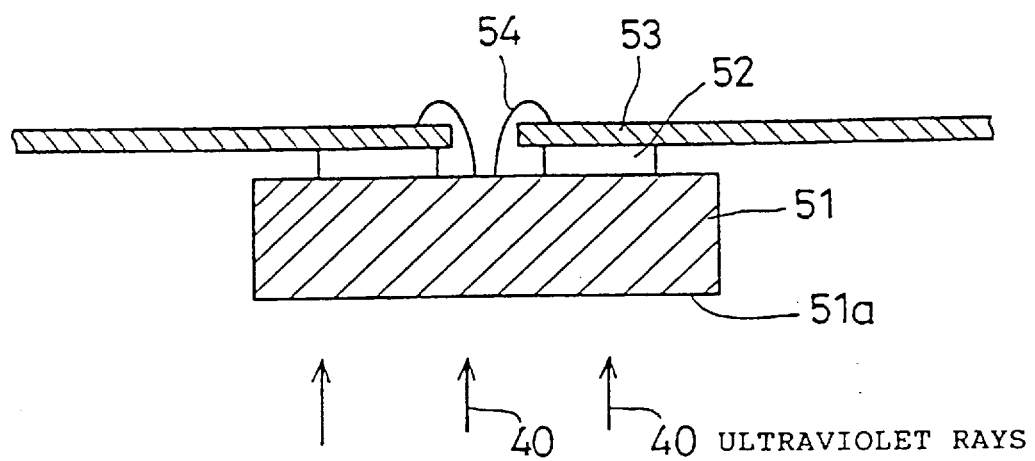
FIG. 11 is a diagram for explaining an ultraviolet cleaning step of the manufacturing steps in FIG. 10.

Next, a description will be given of a sequence of manufacturing steps for manufacturing the semiconductor device 50 in the second embodiment. FIG. 10 shows the sequence of the manufacturing steps. FIG. 11 shows an ultraviolet cleaning step of the manufacturing steps in FIG. 10.

Step 60 in the manufacturing steps in FIG. 10 is a mounting process wherein the inner lead portions 53 are fixed to the top surface of the semiconductor chip 51 by using the adhesive tapes 52. Thus, the semiconductor chip 51 is placed on the bottom of the inner lead portions 53.

Step 61 is a wire bonding process wherein the wires 54 are bonded to the semiconductor chip 51, so as to connect the inner lead portions 53 to an integrated circuit on the semiconductor chip 51 via the corresponding wires 54.

Step 62 is the ultraviolet cleaning process described above. FIG. 11 shows the manner in which the ultraviolet cleaning step 62 is performed. As shown in FIG. 11, at the ultraviolet cleaning step 62, the ultraviolet rays 40 having the wavelengths 1849 Å and 2537 Å are radiated, for a given time period, to the bottom surface 51a of the semiconductor chip 51. The entire bottom surface 51a of the semiconductor chip 51 is subjected to the radiation of the ultraviolet rays.

After the ultraviolet cleaning step 62 is performed, the remaining organic compounds are removed from the semiconductor chip 51 and the bottom surface 51a of the semiconductor chip 51 is modified to be clean and hydrophilic.

Step 63 is a molding process wherein the plastic package 55 is molded, using epoxy resin through a transfer molding procedure, so that the semiconductor chip 51 is enclosed in the plastic package 55. The bottom surface 51a of the semiconductor chip 51 firmly adheres to the plastic package 55.

Step 64 is a plating process wherein the lead 56 outwardly extending from the plastic package 55 is plated with metal.

Step 65 is an ultraviolet cleaning process wherein the ultraviolet rays having the wavelengths 1849 Å and 2537 Å are radiated onto a marking surface of the plastic package 55 for a given time period. This process is similar to the above-described ultraviolet cleaning process at step 62. After the ultraviolet cleaning process at step 65 is performed,, remaining organic compounds are removed from the marking surface of the plastic package 55, and the marking surface is modified to be clean and hydrophilic.

Step 66 is a marking process wherein the plastic package 55 is marked with ink by using a stamper, so that a model number of the semiconductor device or the like is provided on the marking surface of the plastic package 55. As the marking surface of the plastic package 16 is made clean and hydrophilic at step 66, a clear marking can be provided.

Step 67 is a press forming process wherein the lead 56 is bent by using progressive dies.

Accordingly, the semiconductor device 50 in FIG. 7 is produced after the manufacturing steps are performed as described above.

In the semiconductor device in the second embodiment described above, the adhesion between the semiconductor chip and the plastic package after the molding process is performed can be increased, thereby preventing the plastic package from cracking due to the heat stresses. The reliability of the semiconductor device thus manufactured can be increased, and the life of the semiconductor device can be made longer.

Further, the present invention is not limited to the above described embodiments, and variations and modifications may be made without departing from the scope of the present invention.

What is claimed is:

1. A semiconductor device comprising:
   a semiconductor chip having first and second surfaces, only a portion of said second surface having been rendered essentially organic contaminant free by exposure to ultraviolet radiation to improve adhesion between the second surface and resin material;
   a lead overlapping the first surface of said semiconductor chip and being electrically connected to said semiconductor chip; and
   a package of the resin material enclosing said semiconductor chip and a portion of said lead, said package covering said portion of the second surface of said semiconductor chip, and said portion of the second surface of said semiconductor chip being directly contacted by the resin material.

2. The semiconductor device according to claim 1, wherein the portion of said lead has a first end fixed to said semiconductor chip and the lead has a second end projecting outwardly from said package.

3. The semiconductor device according to claim 1, further comprising:
   a wire bonded to the first surface of said semiconductor chip and electrically connecting said lead to said semiconductor chip, said wire being enclosed in said package.

4. The semiconductor device according to claim 1, wherein the lead is connected to the first surface of said semiconductor chip by adhesive tape.

5. A semiconductor device comprising:
   a semiconductor chip having first and second surfaces, said entire second surface having been rendered essentially organic contaminant free by exposure to ultraviolet radiation to improve adhesion between the second surface and resin material;
   a lead having a first portion overlapping the first surface of the semiconductor chip and being electrically connected to the semiconductor chip; and
   a package made of the resin material enclosing said semiconductor chip and said first lead portion, said package fully covering said second surface of said semiconductor chip with the resin material, and said second surface of said semiconductor chip being directly and fully contacted by the resin material of said package, the lead further including a second portion integral with the first portion and projecting outwardly from the resin material.

6. The semiconductor device according to claim 5, further comprising:
   a wire bonded to the first surface of said semiconductor chip and electrically connecting said first lead portion to said semiconductor chip, said wire being enclosed in said package.

7. The semiconductor device according to claim 5, wherein:
   the first lead portion is a plurality of first lead portions arranged in parallel, spaced relationship with respect to each other and to the first surface of the semiconductor chip and project inwardly by a common distance in overlapping the first surface of the semiconductor chip; and
   a common elongated strip of adhesive is disposed between the overlapping first lead portions and a portion of the first surface of the semiconductor chip for mechanically connecting same together.

8. A semiconductor device consisting of:
   a semiconductor chip having first and second surfaces, only a portion of said second surface having been rendered essentially organic contaminant free by exposure to ultraviolet radiation to improve adhesion between the second surface and resin material;
   a set of leads overlapping the first surface of said semiconductor chip and being electrically connected to said semiconductor chip; and
   a package of the resin material enclosing said semiconductor chip and a portion of said leads, said package covering said portion of the second surface of said semiconductor chip, and said portion of the second surface of said semiconductor chip being directly contacted by the resin material.

9. The semiconductor device according to claim 8, wherein the portions of said leads have a first end fixed to said semiconductor chip and each lead has a second end projecting outwardly from said package.

10. The semiconductor device according to claim 8, wherein wires are bonded to the first surface of said semiconductor chip and electrically connect said leads to said semiconductor chip, said wires being enclosed in said package.

11. The semiconductor device according to claim 8, wherein the set of leads is connected to the first surface of said semiconductor chip by adhesive tape.

12. A semiconductor device consisting of:
   a semiconductor chip having first and second surfaces, said entire second surface having been rendered essentially organic contaminant free by exposure to ultraviolet radiation to improve adhesion between the second surface and resin material;
   a plurality of leads each having a first portion overlapping the first surface of the semiconductor chip and being electrically connected to the semiconductor chip; and a package made of the resin material enclosing said semiconductor chip and said first lead portions, said package fully covering said second surface of said semiconductor chip with the resin material, and said second surface of said semiconductor chip being directly and fully contacted by the resin material of said package, the leads further including a second portion integral with the first portions and projecting outwardly from the resin material.

13. The semiconductor device according to claim 12, wherein a set of wires is bonded to the first surface of said semiconductor chip and electrically connects said first lead portions to said semiconductor chip, said wires being enclosed in said package.

14. The semiconductor device according to claim 12, wherein:

the first lead portions are arranged in parallel, spaced relationship with respect to each other and to the first surface of the semiconductor chip and project inwardly by a common distance in overlapping the first surface of the semiconductor chip; and a common elongated strip of adhesive is disposed between the overlapping first lead portions and a portion of the first surface of the semiconductor chip for mechanically connecting same together.

* * * * *